United States Patent
Chang et al.

(10) Patent No.: US 9,660,144 B2
(45) Date of Patent: May 23, 2017

(54) LED PACKAGE AND LED DIE

(71) Applicant: ADVANCED OPTOELECTRONIC TECHNOLOGY, INC., Hsinchu Hsien (TW)

(72) Inventors: Chao-Hsiung Chang, Hsinchu (TW);
Hou-Te Lin, Hsinchu (TW);
Pin-Chuan Chen, Hsinchu (TW);
Lung-Hsin Chen, Hsinchu (TW);
Wen-Liang Tseng, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/832,692

(22) Filed: Aug. 21, 2015

(65) Prior Publication Data
US 2016/0104817 A1      Apr. 14, 2016

(30) Foreign Application Priority Data
Oct. 8, 2014   (CN) .......................... 2014 1 0520548

(51) Int. Cl.
*H01L 33/38*      (2010.01)
*H01L 33/44*      (2010.01)
*H01L 33/48*      (2010.01)

(52) U.S. Cl.
CPC .......... *H01L 33/382* (2013.01); *H01L 33/387* (2013.01); *H01L 33/44* (2013.01); *H01L 33/486* (2013.01); *H01L 2933/0016* (2013.01)

(58) Field of Classification Search
CPC .................................................... H01L 33/382
USPC ..................................... 257/98, 99, 102, 103
See application file for complete search history.

(56) References Cited

U.S. PATENT DOCUMENTS

| | | | |
|---|---|---|---|
| 2006/0157717 A1* | 7/2006 | Nagai | H01L 33/025 257/81 |
| 2007/0176188 A1 | 8/2007 | Tanaka | |
| 2010/0059733 A1* | 3/2010 | Shei | H01L 27/156 257/13 |

FOREIGN PATENT DOCUMENTS

| | | |
|---|---|---|
| CN | 203288637 | 11/2013 |
| TW | 200509417 | 3/2005 |
| TW | M460401 | 8/2013 |
| TW | 201407825 | 2/2014 |

\* cited by examiner

*Primary Examiner* — Marvin Payen
(74) *Attorney, Agent, or Firm* — Steven Reiss (57) ABSTRACT

The present disclosure provides a light emitting diode die which includes a substrate; an N type semiconductor layer, an active layer, and a P type semiconductor layer formed on the substrate in sequence; at least one recess, and a pair of electrodes. The recess extends to the N type semiconductor layer. The insulating layer covers the all of side surfaces of the N type semiconductor layer, the active layer, the P type semiconductor layer, and covers top of the P type semiconductor layer except an opening on the P semiconductor layer. One of the electrodes is filled in the recess and electrically connected to the N type semiconductor layer, and the other one of the electrodes is connected to the P type semiconductor layer in the opening. The present disclosure further provides an LED package having the LED die and a method for manufacturing the same.

13 Claims, 9 Drawing Sheets

LED PACKAGE AND LED DIE

CROSS-REFERENCE TO RELATED APPLICATIONS

This application claims priority to Chinese patent application no. 201410520548.9 filed on Oct. 8, 2014, the contents of which are incorporated by reference herein.

FIELD

The subject matter generally relates to semiconductor element, particularly relates to a light emitting diode (LED) die and an LED package having the same.

BACKGROUND

Illumination devices can be based on one or more different light sources. For example, light sources can include incandescent light bulbs, compact fluorescent lamps and fluorescent tubes. Recent developments have made use of light emitting diodes. In some implantations, the light emitting diode can be packaged via flip chip boding.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

A definition that applies throughout this disclosure will now be presented.

The term "comprising," when utilized, means "including, but not necessarily limited to"; it specifically indicates open-ended inclusion or membership in the so-described combination, group, series and the like.

The present disclosure is described in relation to an LED package.

Figure 1:
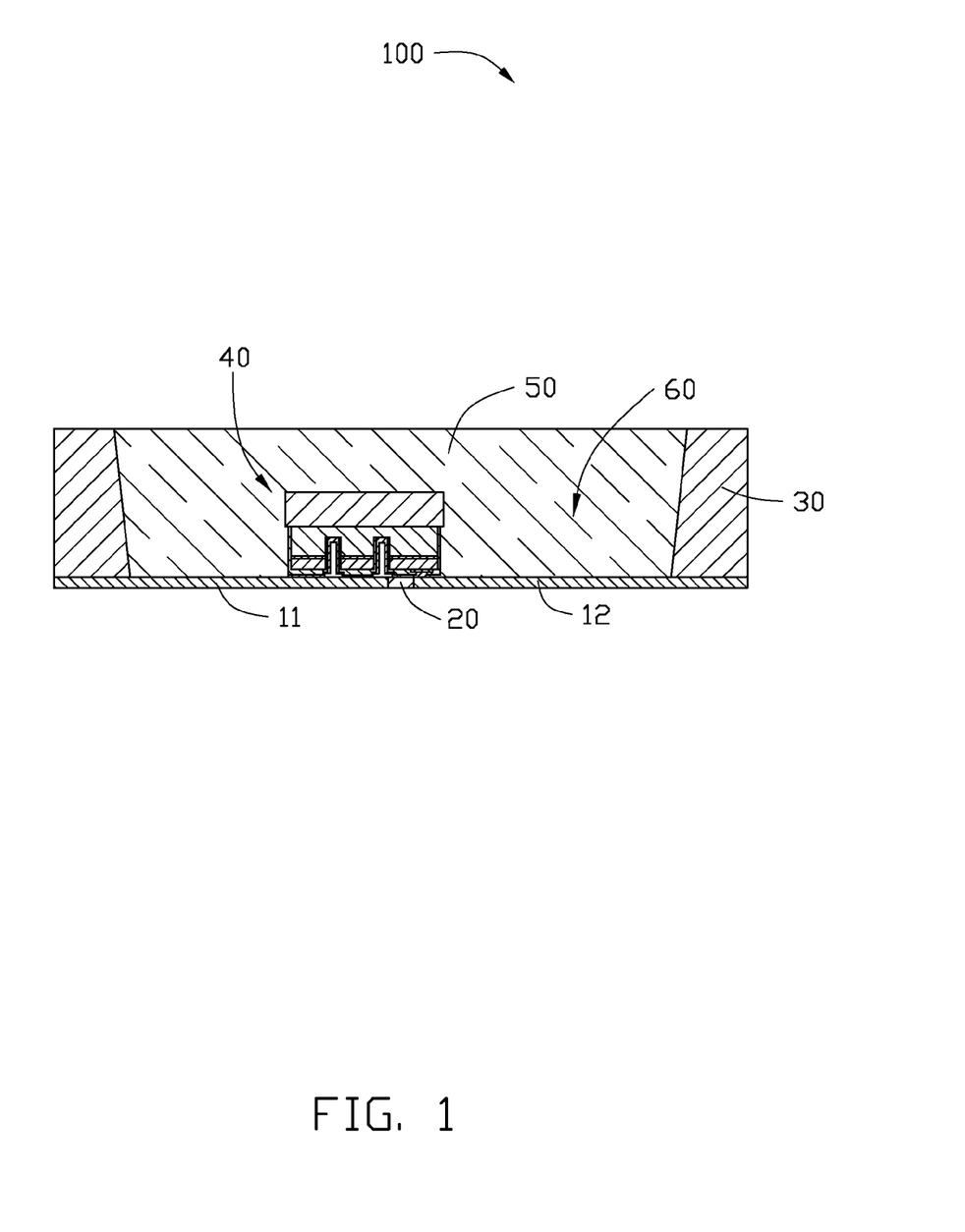
FIG. 1 is a diagrammatic, cross-sectional view of an LED package in accordance with an exemplary embodiment of the present disclosure.

FIG. 1 illustrates an LED package 100. The LED package 100 includes a first frame 11, a second frame 12, an insulator 20, a reflecting cup 30, an LED die 40 and an encapsulation 50.

The first frame 11 and the second frame 12 both have planar surfaces and are both insulated with each other. The first frame 11 and the second frame 12 are both made of metal. In the illustrated embodiment, the first frame 11 and the second frame 12 are made of copper.

The insulator 20 is sandwiched between the first frame 11 and the second frame 12 to electrically separate the first frame 11 and the second frame 12. Top and bottom surfaces of the insulator 20 are coplanar with top and bottom surfaces of the first frame 11 and second frame 12, respectively.

The reflecting cup 30 is formed on the first frame 11 and the second frame 12. A reflecting layer (not shown) is made of material having reflective capability and can be spread on inner surfaces of the reflecting cup 30. The reflecting cup 30, the first frame 11, the second frame 12 and the insulator 20 together surround the LED die 40 to define a cavity 60 for receiving the LED die 40. A size of top of the cavity 60 is larger than that of bottom.

Figure 2:
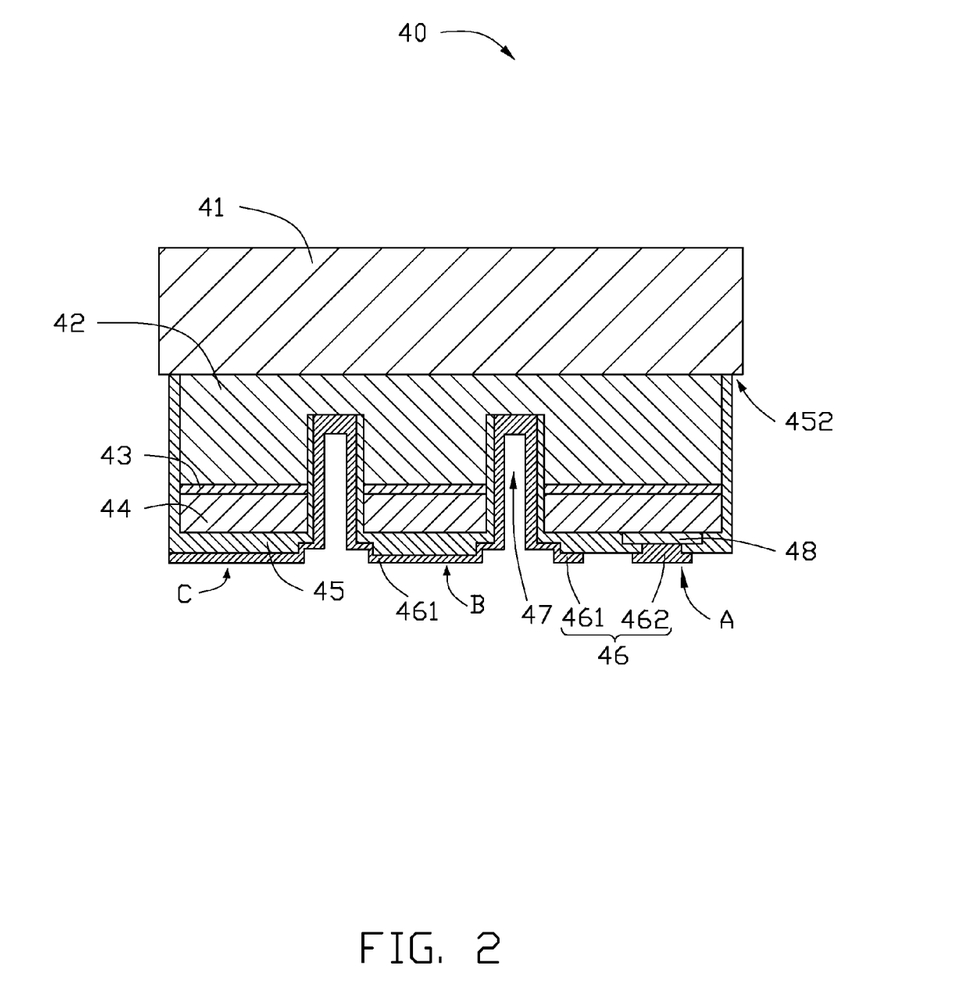
FIG. 2 is a diagrammatic, cross-sectional view of an LED die of the LED package in FIG. 1.

FIG. 2 illustrates a cross section of the LED die 40. The LED die 40 includes a substrate 41, an N type semiconductor layer 42, an active layer 43, a P type semiconductor layer 44, an insulating layer 45, and two electrodes 46 formed on the substrate 41 in sequence.

The substrate 41 is substantially a plate. The substrate 41 is transparent. In the illustrated embodiment, the substrate 41 is made of sapphire.

The N type semiconductor layer 42, the active layer 43 and the P type semiconductor layer 44 are grown on the substrate 41 in sequence. At least one recess 47 is defined in the N type semiconductor layer 42, the active layer 43 and the P type semiconductor layer 44. The recess 47 is recessed from top of the P type semiconductor layer 44 to the N type semiconductor layer 42 to expose a part of the N type semiconductor layer 42. The recess 47 penetrates through the P type semiconductor layer 44 and the active layer 43. The part of the N type semiconductor layer 42 exposed outside of the active layer 43 and the P type semiconductor layer 44 forms a bottom 471 of the recess 47. A middle electrode 48 is formed on the top of the P type semiconductor layer 44 to define a region for the electrodes 46. In the illustrated embodiment, the LED die 40 define two recesses 47. The N type semiconductor layer 42, the active layer 43 and the P type semiconductor layer 44 are divided into three separated islands, which can be labeled as A, B and C. The middle electrode 48 is formed on one of the three islands, for example, A. In the illustrated embodiment, the N type semiconductor layer 42 is made of N type GaN layer. The active layer 43 is muti-quanturm well. The P type semiconductor layer 44 is made of P type GaN layer.

The insulating layer 45 is formed on the substrate 41. Specially, the insulating layer 45 covers all of the side surfaces of the N type semiconductor layer 42, the active layer 43 and the P type semiconductor layer 44 in the recesses 47 and the top of the P type semiconductor layer 44. The insulating layer 45 covers periphery sides of the middle electrode 48 to expose part of top surface of the middle electrode 48. A ladder 452 is formed between outer side surfaces of the insulating layer 45 and side surfaces of the substrate 41. That is to say, the outer side surfaces of the insulating layer 45 are not coplanar with the side surfaces of the substrate 41.

The electrode 46 includes an N type electrode 461 and a P type electrode 462 spaced from each other. The N type electrode 461 attaches the N type semiconductor layer 42 exposed out of the recess 47 to be electrically connected to the N type semiconductor layer 42. The electrodes 46 cover the insulating layer 45 in the recess 47 and extend to cover the insulating layer 45 on top of the P type semiconductor layer 44. The recess 47 has a size that is at least larger than that of a size of the P type electrode 462. One of the electrodes 40 is filled in the recess 47 and electrically connected to the N type semiconductor layer. In the illustrated embodiment, the N type electrode 461 covers the top of the insulating layer 45 on the two islands B and C and extends to periphery of the insulating layer 45 on the other island A, spaced from the P type electrode 462. In other words, the N type electrode 461 covers all of the inner surfaces of the recess 47. The P type electrode 462 covers the exposed middle electrode 48 to electrically connect with the P type semiconductor layer 44. In the illustrated embodiment, a cross section of the P type electrode 462 is substantially an upside down "T" ("⊥") shape.

The LED die 40 is mounted on the first frame 11 and the second frame 12 via flip chip bonding. The N type electrode 461 is mounted on the first frame 11 and electrically connected with the first frame 11. The P type electrode 462 is mounted on the second frame 12 and electrically connected with the second frame 12. In the bonding process, a conducting resin (not shown) is provided between the first frame 11 and the N type electrode 461, also between the second frame 12 and the P type electrode 462. The conducting resin can flow into the recesses 47 and the ladder 452, thereby preventing the conducting resin from overflowing the LED die 40. If the conducting resin overflows the LED die 40, the product has an inferior appearance.

The encapsulation 50 is filled in the cavity 60 to cover the LED die 40. A top surface of the encapsulation 50 is coplanar to the top surface of the reflecting cup 30. The encapsulation 50 can have phosphor powder dropped therein.

When the LED package 100 works, the N type electrode 461 and the P type electrode 462 are electrically connected to the first frame 11 and the second frame 12, respectively. The P type semiconductor layer 44 provides holes, and the N type semiconductor layer 42 provides electrons. When a positive voltage is applied on the P type electrode 462 and the N type electrode 461, the holes of the P type semiconductor layer 44 and the electrons of the N type semiconductor layer 42 gather together to emit light. The light penetrates through the substrate 41 and the encapsulation 50 and travels out of the LED package 100.

Compared with traditional LED packages, the LED die 40 of the LED package 100 has at least one recess 47 penetrating the active layer 43 and the P type semiconductor layer 44 to the N type semiconductor layer 42. The insulating layer 45 covers the N type semiconductor layer 42, the active layer 43, lateral sides of the P type semiconductor layer 44 and top surfaces of the P type semiconductor layer 44, whereby all surfaces of the LED die 40 except for the substrate 41, the N type electrode 461 or the P type electrode 462 is covered by the insulating layer 45. During the bonding process, the conducting resin can flow into the recesses 47 and the ladder 452, thereby preventing the conducting resin from contacting with the LED die 40. If the conducting resin overflows the LED die 40, the product has an electrical short-circuit.

The present disclosure also provides a method for manufacturing an LED die 40.

Figure 3:
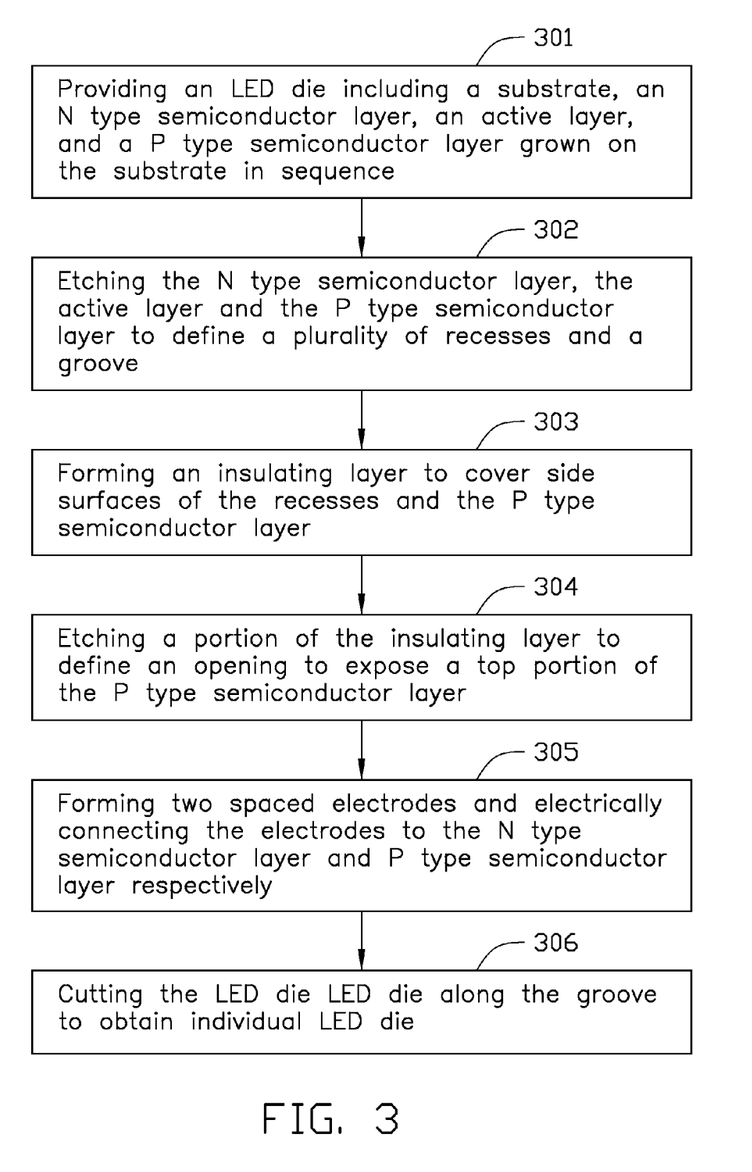
FIG. 3 is a flow chart of a method for forming an epitaxial substrate in accordance with the present disclosure.

FIG. 3 illustrates a flow chart of a method for forming the LED die 40 in accordance with the embodiment of the present disclosure. The example method is provided by way of example, as there are a variety of ways to carry out the method. The method described below can be carried out using the configurations illustrated in FIGS. 4-9, for example, and various elements of these figures are referenced in explaining example method. Each block shown in FIG. 3 represents one or more processes, methods or subroutines, carried out in the example method. Additionally, the illustrated order of blocks is by example only and the order of the blocks can change according to the present disclosure. The example method can begin at block 301.

At block 301, providing an LED die 40a including a substrate 41a, an N type semiconductor layer 42a, an active layer 43a, and a P type semiconductor layer 44a grown on the substrate 41a in sequence.

At block 302, etching the N type semiconductor layer 42a, the active layer 43a and the P type semiconductor layer 44a to define a plurality of recesses 47 and a groove 49.

At block 303, forming an insulating layer 45 to cover side surfaces of the recesses 47 and the P type semiconductor layer 44a.

At block 304, etching a portion of the insulating layer 45 to define an opening 451 to expose a top portion of the P type semiconductor layer 44a.

At block 305, forming two spaced electrodes 46 and electrically connecting the electrodes 46 to the N type semiconductor layer 42a and P type semiconductor layer 44a respectively.

At block 306, cutting the LED die 40a along the groove 49 to obtain individual LED dies 40.

Figure 4:
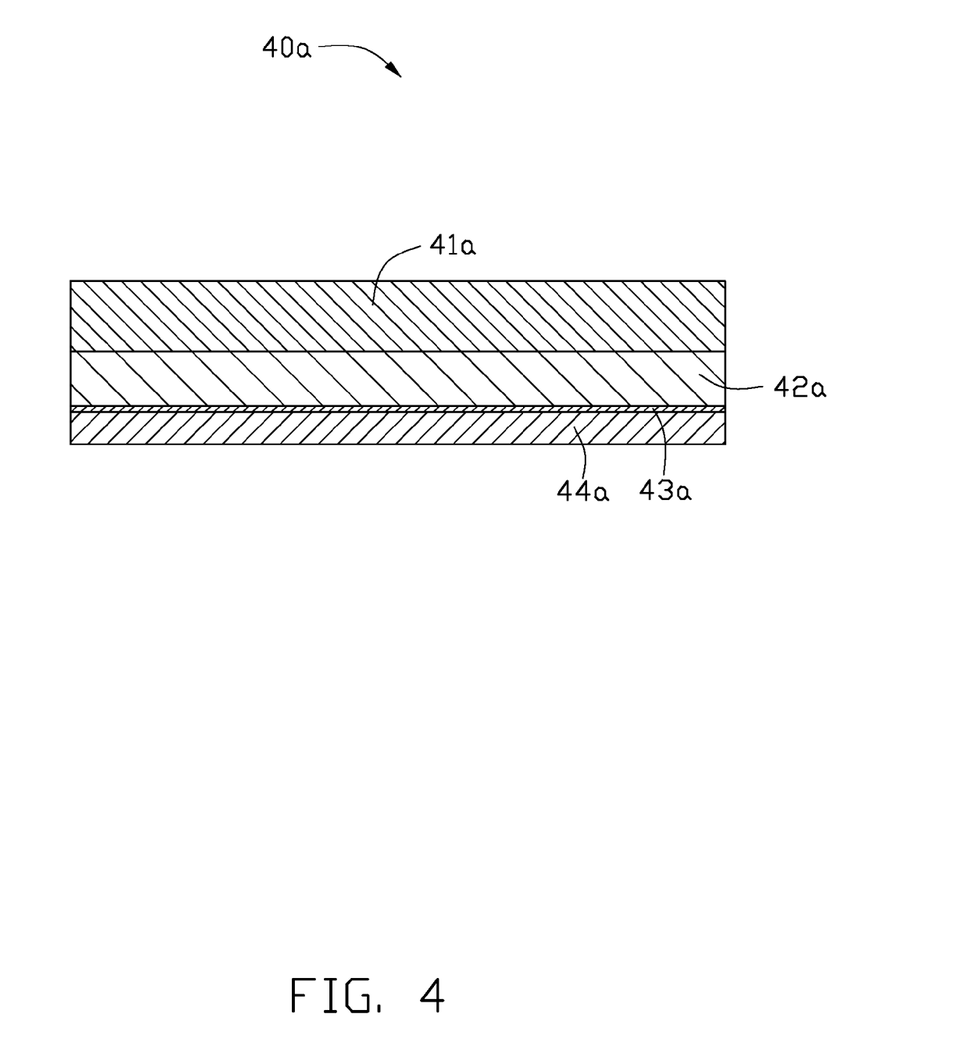
FIG. 4 is diagrammatic cross section showing an LED die in accordance with the embodiment of the present disclosure processed by one of various steps of the light emitting diode method of FIG. 3.

At block 301, referring to FIG. 4, the LED die 40a is transparent and preferably is a monocrystal plate and made of sapphire. The N type semiconductor layer 42a, the active layer 43a and the P type semiconductor layer 44a can be made by Metal-organic Chemical Vapor Deposition (MOCVD), Radio Freqency magnetron Sputter, Chemical Vaporous Depositon (CVD), Physical Vaporous Deposition (PVD), Atomic Layer Deposition (ALD), or Molecular Beam Epitaxy (MBE).

Figure 5:
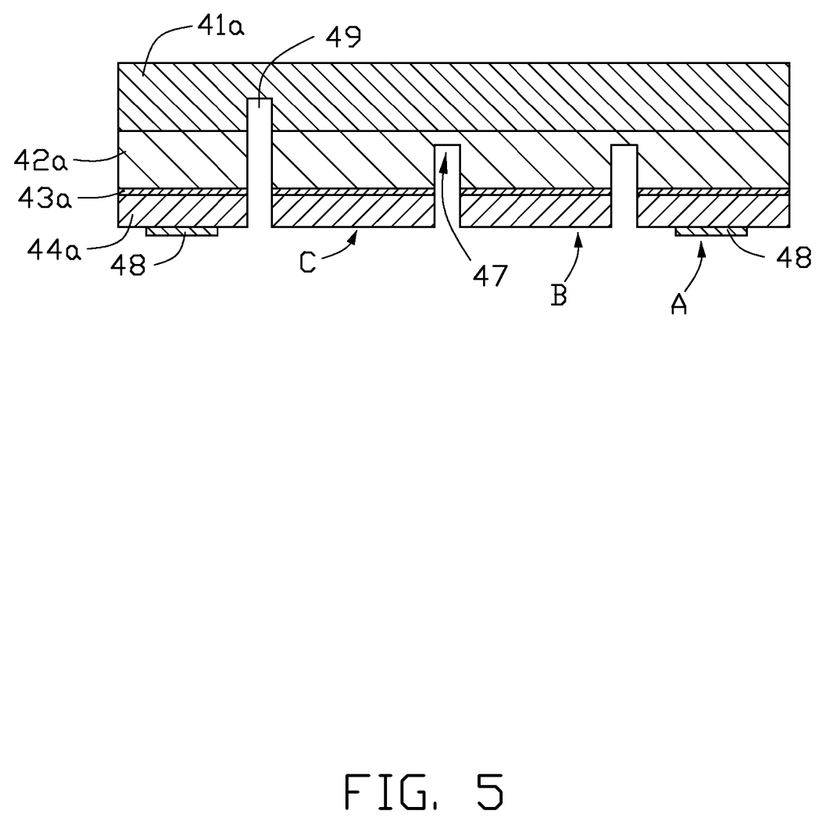
FIG. 5 is diagrammatic cross section showing an LED die in accordance with the embodiment of the present disclosure processed by one of various steps of the light emitting diode method of FIG. 3.

At block 302, referring to FIG. 5, the recess 47 penetrates through the P type semiconductor layer 44a and the active layer 43a and extends to the N type semiconductor layer 42a. The groove 49 penetrates through the P type semiconductor layer 44a, the active layer 43a and N type semiconductor layer 42a and extends to the substrate 41a. In the illustrated embodiment, each LED die 40a includes two recesses 47, whereby the N type semiconductor layer 42a, the active layer 43a and the P type semiconductor layer 44a can be formed as three islands A, B and C. A middle electrode 48 is formed on one of the islands, for example island A.

Figure 6:
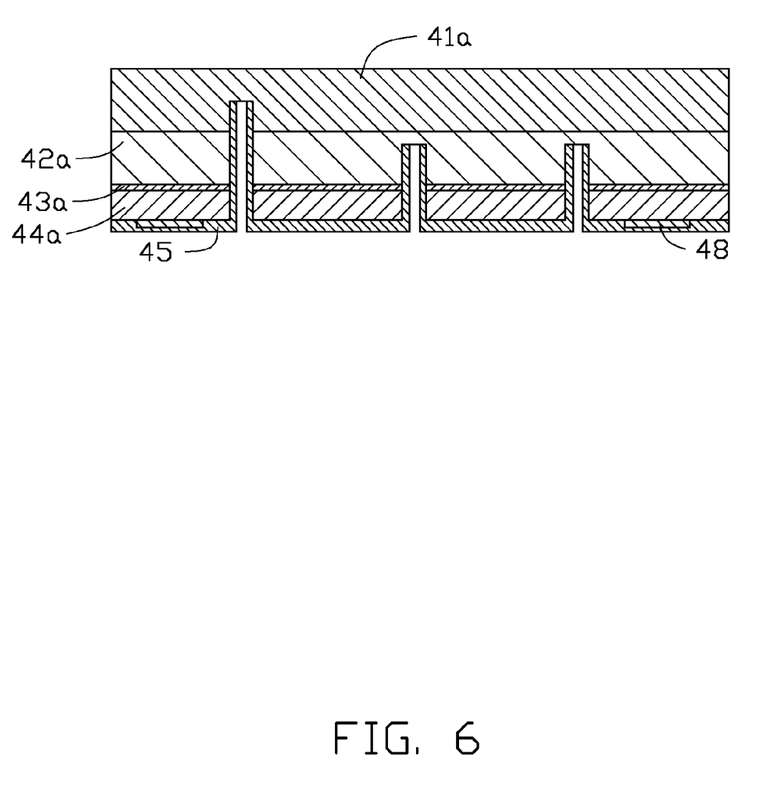
FIG. 6 is diagrammatic cross section showing an LED die in accordance with the embodiment of the present disclosure processed by one of various steps of the light emitting diode method of FIG. 3.

At block 303, referring to FIG. 6, the insulating layer 45 covers all the side surfaces of the N type semiconductor layer 42a, the active layer 43a and the P type semiconductor layer 44a, the top of the P type semiconductor layer 44a and the middle electrode 48. The insulating layer 45 covers periphery sides of the middle electrode 48 to expose part of top surface of the middle electrode 48.

Figure 7:
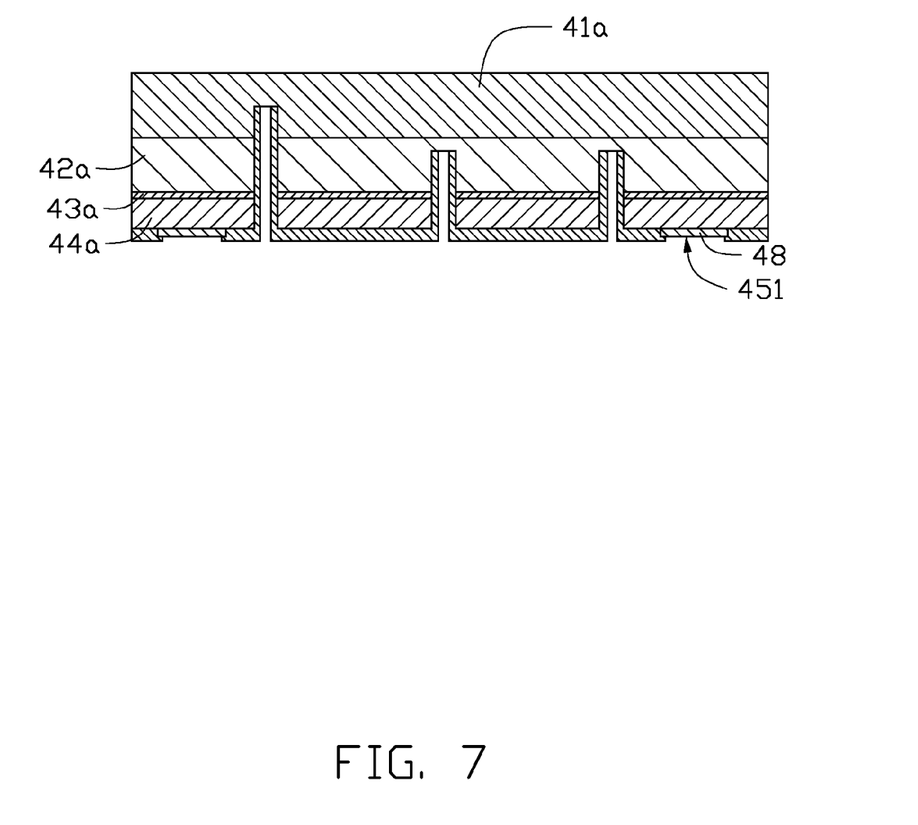
FIG. 7 is diagrammatic cross section showing an LED die in accordance with the embodiment of the present disclosure processed by one of various steps of the light emitting diode method of FIG. 3.

At block 304, referring to FIG. 7, the opening 451 is defined corresponding to the middle electrode 48 to expose the part of top surface of the middle electrode 48.

Figure 8:
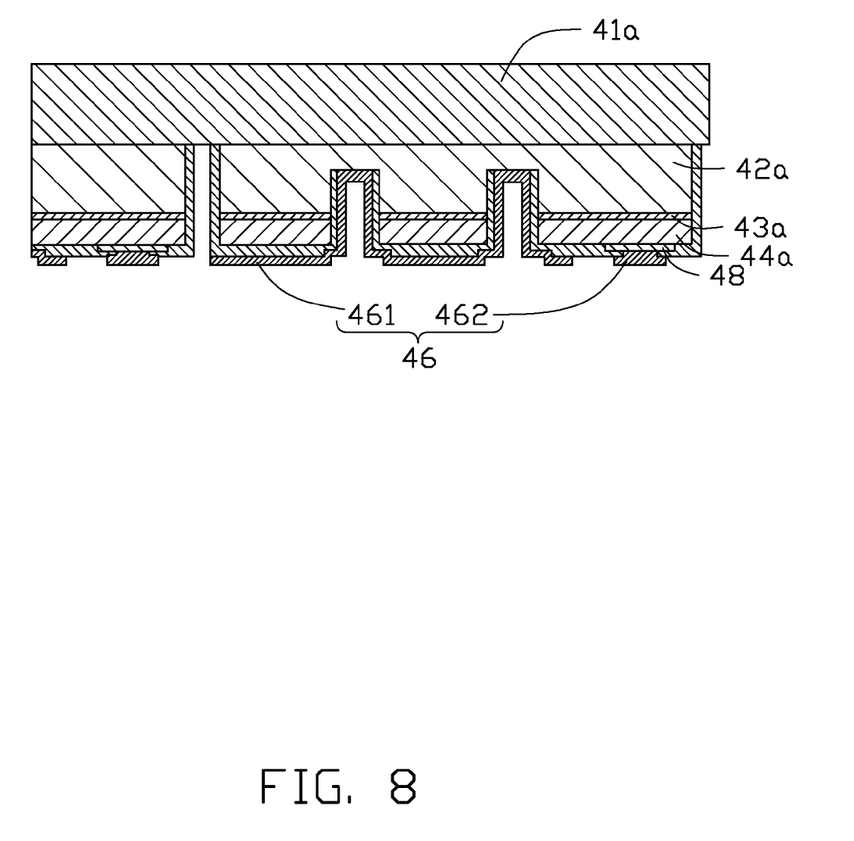
FIG. 8 is diagrammatic cross section showing an LED die in accordance with the embodiment of the present disclosure processed by one of various steps of the light emitting diode method of FIG. 3.

At block 305, referring to FIG. 8, the N type electrode 461 covers the insulating layer 45 in the recesses 47 and extends to cover the insulating layer 45 on top of the P type semiconductor layer 44a. The P type electrode 462 covers the exposed middle electrode 48 to electrically connect with the P type semiconductor layer 44a. A size of the recess 47 is at least larger than that of the P type electrode 462.

Figure 9:
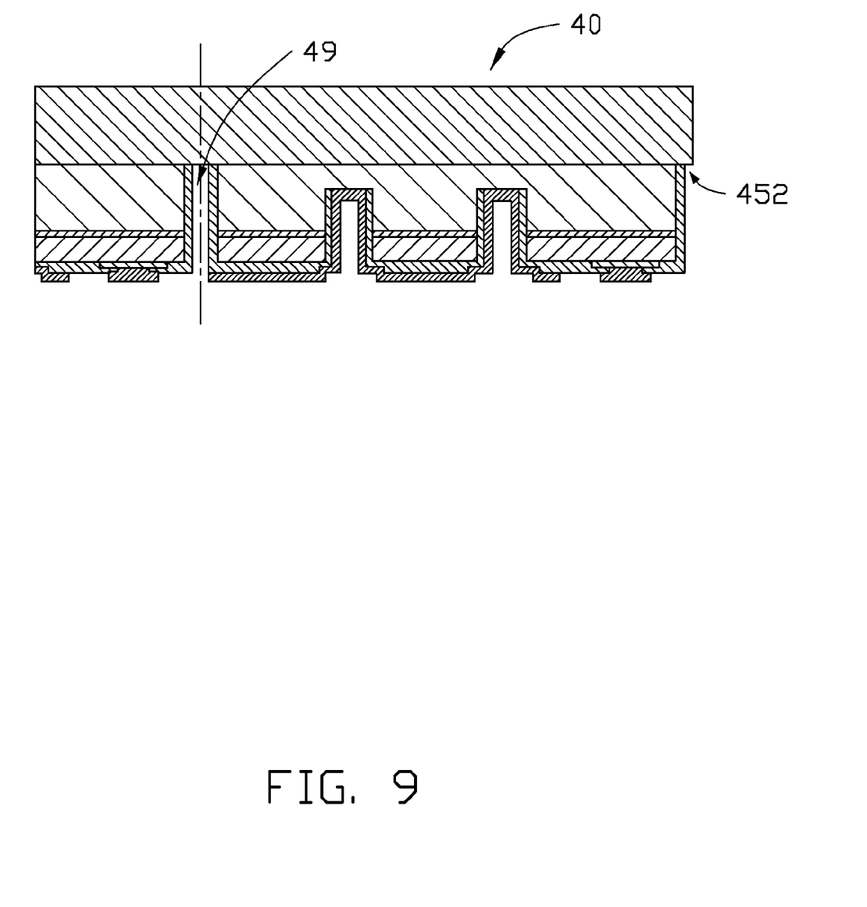
FIG. 9 is diagrammatic cross section showing an LED die in accordance with the embodiment of the present disclosure processed by one of various steps of the light emitting diode method of FIG. 3.

At block 305, referring to FIG. 9, a ladder 452 is formed between outer side surfaces of the insulating layer 45 and side surfaces of the substrate 41. That is to say, the outer side surfaces of the insulating layer 45 are not coplanar with the side surfaces of the substrate 41.

It is to be further understood that even though numerous characteristics and advantages have been set forth in the foregoing description of embodiments, together with details of the structures and functions of the embodiments, the disclosure is illustrative only; and that changes may be made in detail, according in matters of shape, size, and arrangement of parts within the principles of the disclosure to the full extent indicated by the broad general meaning of the terms in which the appended claims are expressed.

The embodiments shown and described above are only examples. Many details are often found in the art such as the other features of an LED package. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A light emitting diode (LED) die comprising:
   a substrate;
   an N type semiconductor layer formed on the substrate;
   an active layer formed on the N type semiconductor layer;
   a P type semiconductor layer formed on the active layer;
   at least one recess penetrating through the P type semiconductor layer and the active layer and partially extending into the N type semiconductor layer to expose at least one part of the N type semiconductor layer;
   an insulating layer covering the all of side surfaces of the N type semiconductor layer, the active layer, the P type semiconductor layer, and covering a top of the P type semiconductor layer except a portion of the P semiconductor layer exposed from an opening defined in the insulating layer; and
   a pair of electrodes, one of the pair of electrodes filling the recess and being electrically connected to the at least one part of the N type semiconductor layer exposed from the recess, and the other one of the pair of electrodes being electrically connected to the portion of the P semiconductor layer exposed from the opening.

2. The LED die of claim 1, wherein there are two recesses, the N type semiconductor layer, the active layer and the P type semiconductor layer are divided into three separated islands.

3. The LED die of claim 2, wherein a middle electrode is formed in the opening on the top of the P type semiconductor layer to preset a region for the electrodes, the middle electrode is formed on one of the three islands, the other one of the electrodes is connected to the P type semiconductor layer through the middle electrode in the opening.

4. The LED die of claim 3, wherein the insulating layer covers periphery sides of the middle electrode to expose part of top surface of the middle electrode.

5. The LED die of claim 1, wherein the electrodes cover the insulating layer in the recess and extends to cover the insulating layer on top of the P type semiconductor layer.

6. The LED die of claim 5, wherein the electrodes comprise an N type electrode and a P type electrode spaced from each other.

7. The LED die of claim 6, wherein the N type electrode attaches on the N type semiconductor layer exposed out of the recess to electrically connect with the N type semiconductor layer, spreads on side surfaces of the insulating layer, and extends to cover the top of the insulating layer spaced from the P type electrode.

8. The LED die of claim 6, wherein and the P type electrode is formed on the opening to electrically connect with the P type semiconductor layer.

9. The LED die of claim 6, wherein a size of the recess is at least larger than that of the P type electrode.

10. The LED die of claim 1, wherein a ladder is formed between outer side surfaces of the insulating layer and side surfaces of the substrate.

11. A light emitting diode (LED) package, comprising:
    a first frame and a second frame insulated with the first frame;
    an LED die mounted on and electrically connected to the first frame and the second frame, the LED die comprising:
    a substrate;
    an N type semiconductor layer, an active layer, and a P type semiconductor layer formed on the substrate in sequence;
    at least one recess penetrating through the P type semiconductor layer and the active layer and partially extending into the N type semiconductor layer to expose at least one part of the N type semiconductor layer;
    an insulating layer covering the all of side surfaces of the N type semiconductor layer, the active layer, the P type semiconductor layer, and covering top of the P type semiconductor layer except a portion of the P semiconductor layer exposed from an opening defined in the insulating layer; and
    a pair of electrodes, one of the electrodes filled in the recess and electrically connected to the at least one part of the N type semiconductor layer exposed from the recess, and the other one of the electrodes electrically connected to the portion of the P semiconductor layer exposed from the opening.

12. The LED package of claim 11, wherein an insulator is sandwiched between the first frame and the second frame to electrically separate the first frame and the second frame.

13. The LED package of claim 12, wherein a reflecting cup is formed on the first frame and the second frame, the reflecting cup, the first frame, the second frame and the insulator together surround the LED die to define a cavity for receiving the LED die.

* * * * *